(12) United States Patent
Nguyen et al.

(10) Patent No.: US 10,892,021 B2
(45) Date of Patent: Jan. 12, 2021

(54) ON-DIE CAPACITOR FOR A MEMORY DEVICE

(71) Applicant: SanDisk Technologies LLC, Addison, TX (US)

(72) Inventors: Qui Nguyen, San Jose, CA (US); Arka Ganguly, San Jose, CA (US)

(73) Assignee: SanDisk Technologies LLC, Addison, TX (US)

(*) Notice: Subject to any disclaimer, the term of this patent is extended or adjusted under 35 U.S.C. 154(b) by 37 days.

(21) Appl. No.: 16/216,719

(22) Filed: Dec. 11, 2018

(65) Prior Publication Data

US 2019/0371414 A1    Dec. 5, 2019

Related U.S. Application Data

(60) Provisional application No. 62/681,080, filed on Jun. 5, 2018.

(51) Int. Cl.

| | | |
|---|---|---|
| *G11C 16/30* | (2006.01) | |
| *G11C 16/10* | (2006.01) | |
| *G11C 16/26* | (2006.01) | |
| *G11C 16/16* | (2006.01) | |
| *G11C 16/08* | (2006.01) | |
| G11C 16/04 | (2006.01) | |
| H01L 27/11556 | (2017.01) | |
| H01L 27/11582 | (2017.01) | |

(52) U.S. Cl.
CPC .............. *G11C 16/30* (2013.01); *G11C 16/08* (2013.01); *G11C 16/10* (2013.01); *G11C 16/16* (2013.01); *G11C 16/26* (2013.01); *G11C 16/0483* (2013.01); *H01L 27/11556* (2013.01); *H01L 27/11582* (2013.01)

(58) Field of Classification Search
CPC ......... G11C 16/30; G11C 16/10; G11C 16/26; G11C 16/16; G11C 16/08; G11C 16/0483; G11C 5/145
See application file for complete search history.

(56) References Cited

U.S. PATENT DOCUMENTS

| | | | |
|---|---|---|---|
| 5,646,894 | A | 7/1997 | Lin et al. |
| 5,708,387 | A | 1/1998 | Cleveland et al. |
| 7,139,205 | B1 | 11/2006 | Goldman et al. |
| 9,030,863 | B2 | 5/2015 | Gulati et al. |
| 9,536,617 | B2 | 1/2017 | Al-Shamma et al. |
| 9,959,926 | B2 | 5/2018 | Hebig et al. |
| 10,002,654 | B2 | 6/2018 | Kulkarni et al. |
| 2013/0121088 | A1 | 5/2013 | Yu et al. |
| 2016/0005441 | A1* | 1/2016 | Yang ............... G11C 16/30 365/226 |

* cited by examiner

*Primary Examiner* — Mohammed A Bashar
(74) *Attorney, Agent, or Firm* — Vierra Magen Marcus LLP

(57) ABSTRACT

Apparatuses, systems, methods, and computer program products are disclosed for an on-die capacitor. A memory chip comprises an array of memory cells. A capacitor is electrically coupled to an array of memory cells. A capacitor receives at least a portion of discharged electricity from an operation for an array of memory cells. A capacitor supplies electricity back to an array of memory cells during a subsequent operation for an array of memory cells.

20 Claims, 13 Drawing Sheets

ON-DIE CAPACITOR FOR A MEMORY DEVICE

CROSS-REFERENCES TO RELATED APPLICATIONS

This application claims the benefit of U.S. Provisional Patent Application No. 62/681,080 entitled "ON-DIE CAPACITOR FOR A MEMORY DEVICE" and filed on Jun. 5, 2018 for Qui Nguyen, et al. which is incorporated herein by reference in its entirety for all purposes.

TECHNICAL FIELD

The present disclosure, in various embodiments, relates to non-volatile and/or volatile memory and more particularly relates to on-die power storage for a non-volatile and/or volatile memory device to reduce operational power.

BACKGROUND

In a memory device, voltages are routinely ramped up to operational levels (e.g., a program voltage, an erase voltage, a read voltage, a bias voltage) and then discharged between operations or for the next operation. While effective, simply discharging current to ground wastes power and requires a greater current draw to ramp up for the next operation.

SUMMARY

Apparatuses are presented for an on-die capacitor. In one embodiment, a memory chip comprises an array of memory cells. A capacitor, in certain embodiments, is electrically coupled to an array of memory cells. A capacitor, in some embodiments, receives at least a portion of discharged electricity from an operation for an array of memory cells. A capacitor, in a further embodiment, supplies electricity back to an array of memory cells during a subsequent operation for an array of memory cells.

Other apparatuses are presented for an on-die capacitor. In one embodiment, a controller is configured to discharge electrical charge from control lines of a first erase block of a memory element in connection with a first memory operation on the first erase block. A supply circuit, in some embodiments, is configured to supply electrical charge for a second memory operation from a second erase block of a memory element. A second erase block of a memory element, in one embodiment, is configured to receive a discharged electrical charge from a first erase block. A second erase block of a memory element, in a further embodiment, is configured to store discharged electrical charge from a first erase block using a capacitance between control lines of the second erase block.

An apparatus, in some embodiments, includes means for storing electrical charge from current discharged from an operation on a non-volatile memory array. An apparatus, in a further embodiment, includes means for charging, for a different operation, a plurality of electrical lines of a non-volatile memory array to a first voltage using stored electrical charge. In certain embodiments, an apparatus includes means for charging a plurality of electrical lines of a non-volatile memory array to a second voltage higher than a first voltage for a different operation.

Methods are presented for an on-die capacitor. In one embodiment, a method includes discharging, to a capacitor, electrical charge from unselected word lines of a first memory operation on a memory array. A method, in certain embodiments, includes storing discharged electrical charge in a capacitor. In a further embodiment, a method includes charging unselected word lines for a second memory operation on a memory array using stored electrical charge from a capacitor.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
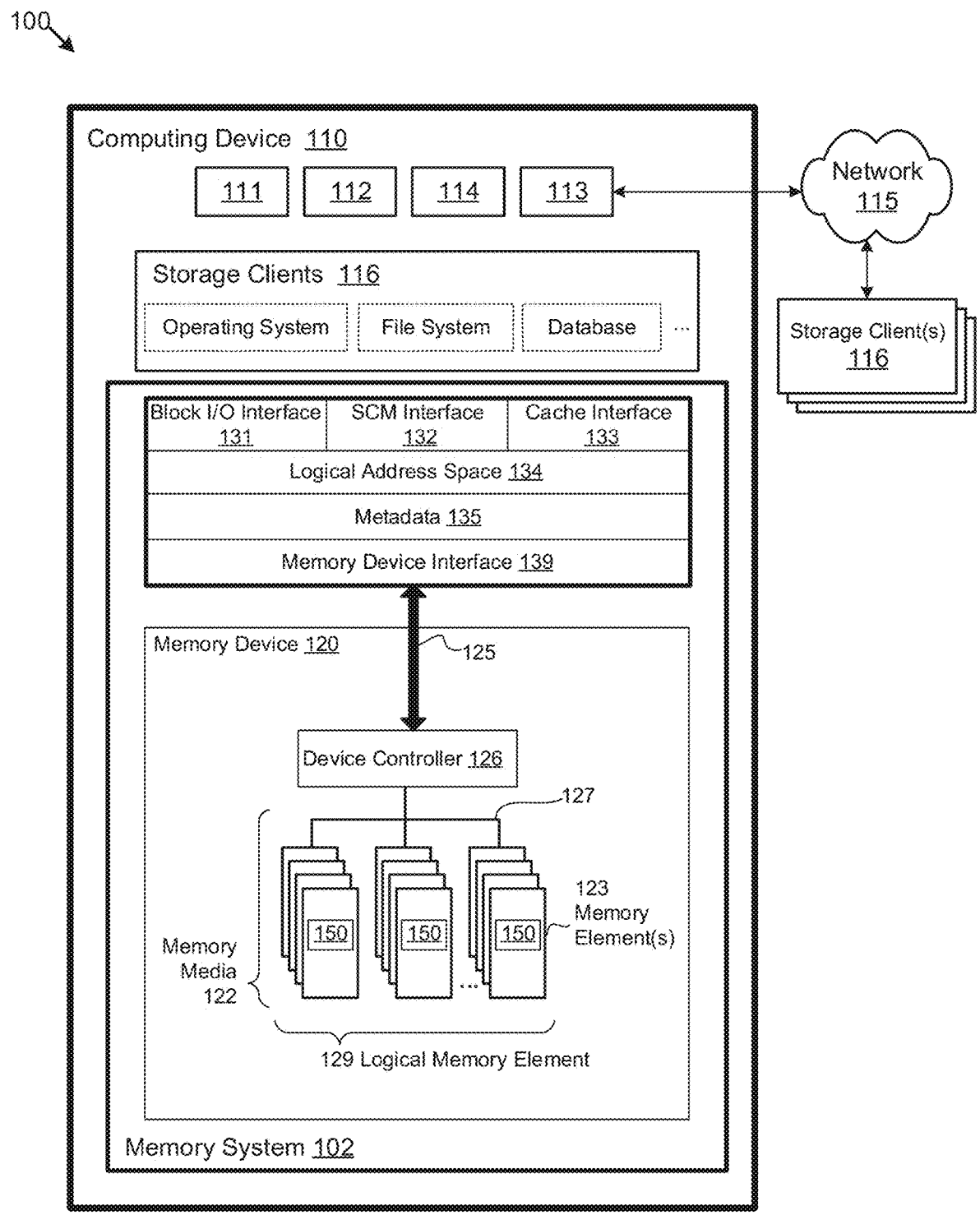
FIG. 1 is a schematic block diagram illustrating one embodiment of a system for an on-die capacitor.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 for an on-die capacitor 150. The system 100 comprises one or more capacitors 150 for memory media 122 of a non-volatile and/or volatile memory device 120. A capacitor 150 may be part of a non-volatile and/or volatile memory element 123 (e.g., disposed on a same integrated circuit device as a non-volatile memory media 122, bonded and/or otherwise coupled to an integrated circuit device of non-volatile memory media 122, or the like). In this manner, in certain embodiments, a capacitor 150 may store discharged electricity (e.g., discharged electrical current from word lines or other electrical lines of a memory array may charge the capacitor 150) from one memory operation for use in a subsequent memory operation.

A memory operation, as used herein, may comprise any event for which a voltage is applied to a control line such as a word line, bit line, and/or another electrical line of a memory element 123. For example, a memory operation may include a read operation, a program/write operation, an erase operation, a set operation, a reset operation, a refresh operation, a program verify operation, an erase verify operation, a garbage collection operation, a copyback operation, a management operation, or the like. Electricity (e.g., electrical charge and/or current) may be discharged from control lines or other electrical lines of a memory element 123 in connection with a memory operation as a stage/step or other part of the memory operation itself, as a separate discharge operation performed in response to the memory operation (e.g., once the memory operation and/or a predefined portion thereof is complete), or the like.

In some embodiments, a memory device 120 may at least partially operate on and/or in communication with a non-volatile and/or volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or memory controller 126 to a communication network 115, such as an Internet Protocol (IP) network, a Storage Area Network (SAN), wireless network, wired network, or the like.

A capacitor 150, as used herein, comprises any electrical circuit and/or component that stores potential energy. For example, a capacitor 150 may comprise a passive, two-terminal electrical component that stores potential energy in an electrical field. A capacitor 150 may comprise at least two electrical conductors (e.g., conductive plates or other surfaces, word lines of a memory array, foil, thin film, metal, an electrolyte, or the like) separated by a dielectric medium (e.g., oxide layer, glass, ceramic, plastic film, paper, mica, or the like). In certain embodiments, for deposition as part of a memory element 123 or other integrated circuit device, a capacitor 150 may comprise a metal-insulator-metal, a metal-oxide-metal, a fringe capacitor (e.g., comprising one metal layer and relying on fringe and/or side capacitance), and/or another type of capacitor that may be formed as part of an integrated circuit device 123. A capacitor 150 may comprise one or more circuits or other logic hardware of an integrated circuit device, such as a die and/or chip 123 of memory media 122 (e.g., a memory element 123 or other integrated circuit device 123).

Figure 2:
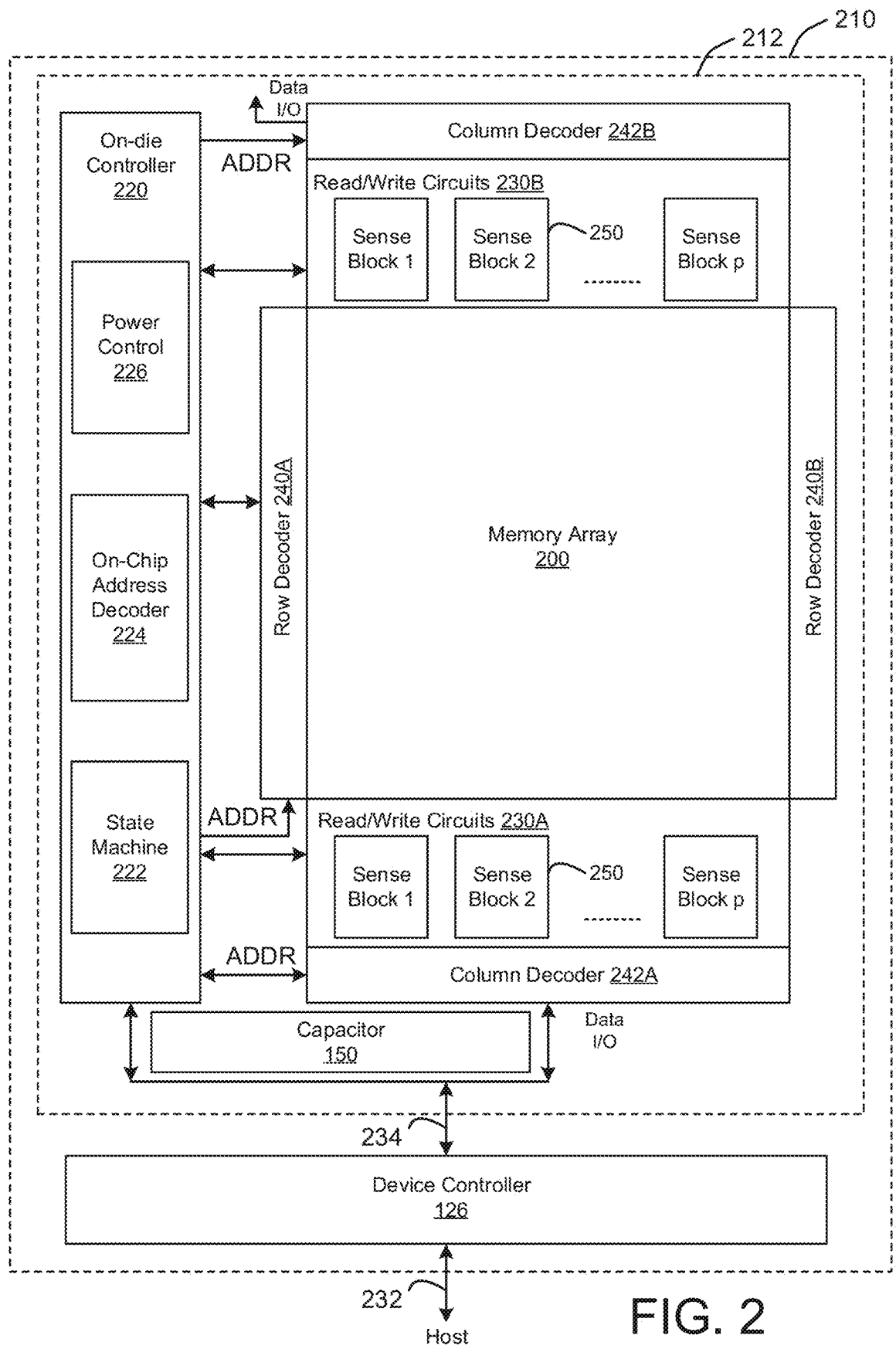
FIG. 2 is a schematic block diagram illustrating another embodiment of a system for an on-die capacitor.

In one embodiment, a capacitor 150 may be disposed at or toward an edge and/or periphery of a memory element 123, adjacent and/or next to an array of memory media 122 (e.g., as depicted in FIG. 2). In a further embodiment, a capacitor 150 may be disposed on a different level, layer, and/or plane of an integrated circuit device 123 than an array of memory media 122 (e.g., as CMOS or other circuit under the array, parallel with and offset from the array, or the like). Forming and/or placing a capacitor 150 on a different level of an integrated circuit device 123 than an array of memory media 122, in certain embodiments, may conserve space of the integrated circuit device 123, allowing more circuits (e.g., one or more capacitors 150, microprocessors, processing units, a larger array of memory media 122, or the like), a smaller integrated circuit device 123, or the like. In certain embodiments, through-silicon vias (e.g., TSVs) between different levels of an integrated circuit device 123 may provide electrical connections between one or more capacitors 150 and an array of memory media 122. In a further embodiment, a capacitor 150 may be disposed on a different integrated circuit device than an integrated circuit device 123 of an array of memory media 122 and bonded or otherwise electrically coupled to the integrated circuit device 123, or the like.

In certain embodiments, an integrated circuit device 123 may comprise one or more capacitors 150, super capacitors 150, batteries 150, and/or other electrical storage devices. A capacitor 150 and/or another electrical storage device 150 may be on the same level and/or a different layer as a memory array (e.g., a different level and/or layer than a memory array, parallel to and offset from a level of the memory array, or the like), may be on multiple different levels and/or layers (e.g., multiple different levels and/or layers than the memory array, parallel to and offset from a level of the memory array and from each other, or the like), may be on one or more same levels and/or layers as a memory array, may be on a separate integrated circuit device than the memory array, or the like.

As the number of word lines, erase blocks, and/or memory cells in memory elements 123 increase (e.g., for increased capacity, increased parallelism, or the like), the power usage (e.g., peak power, peak current, or the like) also increases. For example, if one word line is selected for programming, the rest of the word lines (e.g., 127 out of 128 word lines, or the like) receive a bias or pass voltage, each in parallel. Ramping each of the unselected word lines to the operational voltage (e.g., a pass voltage, a bias voltage, or the like), in certain embodiments, draws a large current, and may be repeated for many operations over the lifetime of the memory device 120.

In order to reduce power consumption during a voltage ramp up period for a memory operation (e.g., a read, erase, write/program, or the like), in some embodiments, the capacitor 150 stores electricity from a previous operation rather than simply draining the current to ground in response to the previous operation completing. The one or more capacitors 150, in certain embodiments, may have a larger capacitance than word line capacitors and/or word line capacitance associated with the word lines (e.g., 1.5 times, double, 2.5 times, triple, or the like), such as about 2-15 nF, about 5-10 nF, about 6-9 nF, about 7-8 nF, about 7.5 nF, or the like.

In various embodiments, as described below, the capacitor 150 may be disposed in a layer under/beneath the memory array of a memory element 123, next to a memory array of a memory element 123 (e.g., toward an edge or periphery of the memory element 123), on a different integrated circuit device bonded or otherwise electrically coupled to a memory element 123 with a memory array, or the like. In a further embodiment, at least a portion of the capacitance for the one or more capacitors 150 may come from the word lines of the memory medium 122 itself. For example, unused dummy word lines (e.g., toward an edge of an erase block of data, in one or more dedicated dummy erase blocks that do not store data, or the like) which do not store data, may be configured with positive and negative terminals (e.g., even dummy word lines may have positive terminals and odd dummy word lines may have negative terminals, or vice versa), such that the dummy word lines themselves may form a capacitor 150. To prevent leakage, dummy word lines or other word lines used as capacitors may be disconnected, decoupled, and/or gated off from bit lines, or the like.

In certain embodiments, the one or more capacitors 150 may not store enough electrical charge and/or a high enough voltage to provide a desired operational voltage for a memory operation. During a reset or initialization stage (e.g., in response to a reset clock or the like), if a capacitor 150 has not yet been charged, it may be charged using an initialization voltage (e.g., VCC) on one terminal, and a low-voltage charge pump output voltage (e.g., VSS) on an opposite terminal, or the like. During a first, low voltage ramp up period, one or more capacitors 150 may drive an operational voltage (e.g., on one or more word lines, or the like) up to a first target voltage (e.g., a voltage at or near an output of the one or more capacitors 150, or the like).

A high voltage charge pump, in some embodiments, is not used during the first, low voltage ramp up period, is used at a lower voltage level, or the like, in order to conserve power. The high voltage charge pump, in certain embodiments, may be engaged and/or an output voltage of the high voltage charge pump increased, to drive the operational voltage (e.g., on the one or more word lines, or the like) up to a second target voltage (e.g., a bias voltage, pass voltage, read voltage, erase voltage, program voltage, and/or another operational voltage for performing a memory operation). For example, a capacitor 150 may store a charge of 4V, and a high voltage charge pump may drive the load up to 7V, 8V, 10V, or another target operational voltage. In one embodiment, a switch disconnects the one or more capacitors 150 from the load (e.g., the unselected word lines, or the like) while the high voltage charge pump drives the load. Depending on the type of operation, the order of operation, the pattern of data being programmed, or the like, in certain embodiments, the output voltage may be regulated at a target operational voltage level for execution of an operation, for multiple operations, for multiple phases or steps of an operation, or the like.

A first multiplexer or "MUX" (e.g., CCR_TOP), in certain embodiments, may split the output current of the one or more capacitors 150 and/or the high voltage charge pump to provide it to a plurality of word lines or other loads. A second multiplexer or MUX (e.g., CGEQ), in one embodiment, may combine the current being drained from multiple word lines, multiplexing it back down to a single signal to charge the one or more capacitors 150 after an operation, or the like.

A memory element 123, in one embodiment, comprises at least one capacitor 150 per die plane. In a further embodiment, a memory element 123 may comprise at least one capacitor per die. In some embodiments, a memory element 123 may comprise at least one capacitor 150 per chip.

The memory device 120, in various embodiments, may be disposed in one or more different locations relative to the computing device 110. In one embodiment, the memory device 120 comprises one or more non-volatile and/or volatile memory elements 123, such as semiconductor chips or packages or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a memory card, a universal serial bus (USB) drive, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. In one embodiment, a capacitor 150 may comprise hardware of a non-volatile and/or volatile memory element 123, other electrical component, or the like. In one embodiment, a capacitor 150 is integrated on a memory element 123 (e.g., an on-die capacitor 150 and/or other integrated hardware).

According to various embodiments, a memory controller 126 may manage one or more memory devices 120 and/or memory elements 123, one or more of which may comprise an on-die capacitor 150. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units and/or regions may include, but are not limited to: pages, memory divisions, blocks, sectors, collections or sets of physical storage locations (e.g., logical pages, logical blocks), or the like.

A device driver and/or the memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the memory device 120 may maintain metadata 135, such as a logical to physical address mapping structure, to map logical addresses of the logical address space 134 to media storage locations on the memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more memory devices 120. The one or more memory devices 120 may include different types of memory devices including, but not limited to: solid-state storage devices, semiconductor storage devices, SAN storage resources, volatile memory devices, non-volatile memory devices, or the like. The one or more memory devices 120 may comprise one or more respective memory media controllers 126 and memory media 122. A device driver may provide access to the one or more memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the memory device 120. Also, in some embodiments, the SCM interface 132 presented to the storage clients 116 provides access to data transformations implemented by the one or more memory devices 120 and/or the one or more memory media controllers 126.

A device driver may present a logical address space 134 to the storage clients 116 through one or more interfaces. As discussed above, the logical address space 134 may comprise a plurality of logical addresses, each corresponding to respective media locations the on one or more memory devices 120. A device driver may maintain metadata 135 comprising any-to-any mappings between logical addresses and media locations, or the like.

A device driver may further comprise and/or be in communication with a memory device interface 139 configured to transfer data, commands, and/or queries to the one or more memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The memory device interface 139 may communicate with the one or more memory devices 120 using input-output control (IO-CTL) command(s), IO-CTL command extension(s), remote direct memory access, or the like.

The communication interface 113 may comprise one or more network interfaces configured to communicatively couple the computing device 110 and/or the memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The memory controller 126 is part of and/or in communication with one or more memory devices 120. Although FIG. 1 depicts a single memory device 120, the disclosure is not limited in this regard and could be adapted to incorporate any number of memory devices 120, a combination of one or more volatile memory devices 120 and one or more non-volatile memory devices 120, or the like.

The memory device 120 may comprise one or more elements 123 of memory media 122. In one embodiment, an element 123 of memory media 122 comprises a volatile memory medium 122, such as random access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 123 of memory media 122 comprises a non-volatile memory medium 122, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magnetoresistive RAM (MRAM), magnetic storage media (e.g., hard disk, tape), optical storage media, or the like. The one or more elements 123 of memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102. A device driver may further comprise a non-volatile memory device interface 139 that is configured to transfer data, commands, and/or queries to the non-volatile memory media controller 126 over a bus 125, as described above.

FIG. 2 illustrates an embodiment of a non-volatile storage device 210 that may include one or more memory die or chips 212, with one or more capacitors 150. The nonvolatile storage device 210 may be substantially similar to the nonvolatile memory device 120 described with reference to FIG. 1. While the one or more capacitors 150 of FIG. 2 are depicted toward a periphery of the memory die and/or chip 212 (e.g., on a same physical level as the memory array 200 in an integrated circuit device 123), in other embodiments, one or more capacitors 150 may be disposed on a different physical level of the memory die and/or chip 212 than the memory array 200 (e.g., parallel to and offset from a level of the memory array 200 in an integrated circuit device 123), as depicted in FIG. 6.

The memory die 212, in some embodiments, includes an array 200 (e.g., two-dimensional or three dimensional) of memory cells, an on-die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

On-die controller 220, in one embodiment, cooperates with the read/write circuits 230A/230B to perform memory operations on the memory array 200. The on-die controller 220, in certain embodiments, includes a state machine 222, an on-chip address decoder 224, and a power control circuit 226. In one embodiment, the on-chip address decoder 224 and/or the power control circuit 226 may be part of and/or controlled by the micro-controller 150.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In one embodiment, one or any combination of on-die controller 220, state machine 222, power control circuit 226, decoder circuit 224, decoder circuit 242A, decoder circuit 242B, decoder circuit 240A, decoder circuit 240B, read/write circuits 230A, read/write circuits 230B, and/or controller 244 can be referred to as one or more managing circuits.

Figure 3:
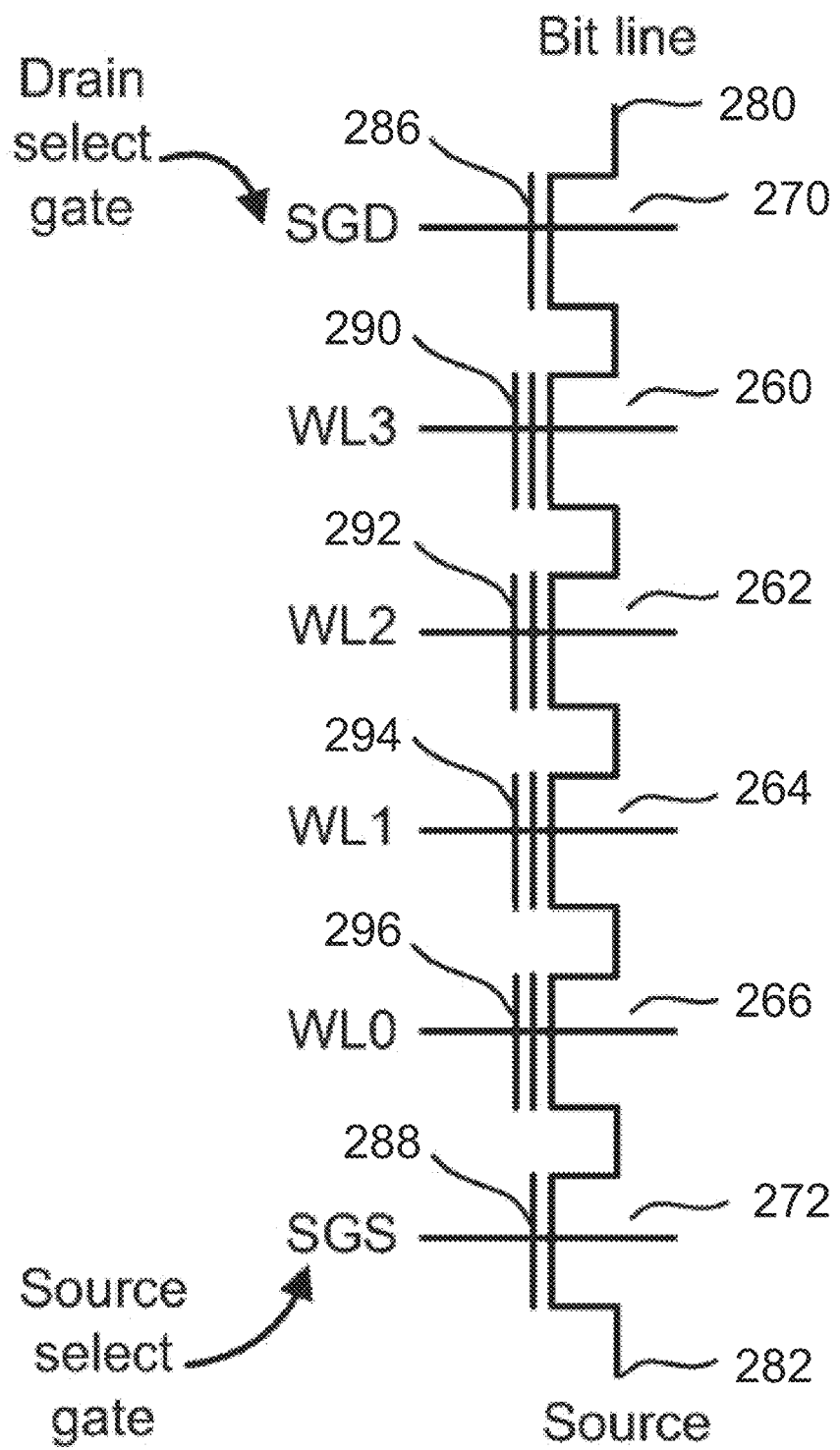
FIG. 3 is a schematic block diagram illustrating one embodiment of a string of memory cells.

FIG. 3 depicts one embodiment of a memory string comprising a plurality of storage elements. The memory string depicted in FIG. 3, in some embodiments, includes four transistors 260, 262, 264, and 266 connected in series and located between a first select transistor 270 and a second select transistor 272. In some embodiments, a transistor 260, 262, 264, and 266 includes a control gate and a floating gate. A control gate 290, 292, 294, and 296, in one embodiment, is connected to, or comprises a portion of, a word line. In a further embodiment, a transistor 260, 262, 264, and 266 is a storage element, storage cell, or the like, also referred to as a memory cell such that the terms memory cell and storage cell are interchangeable. In some embodiments, a storage element may include multiple transistors 260, 262, 264, and 266.

The first select transistor 270, in some embodiments, gates/connects the memory string connection to a bit line 280 via a drain select gate SGD. The second select transistor 272, in certain embodiments, gates/connects the memory string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 3, the source line 282, in one embodiment, is connected to the sources of each transistor/storage cell 260, 262, 264, and 266 in the memory string. The memory string, in some embodiments, may include some storage elements 260, 262, 264, and 266 that have been programmed and some storage elements 260, 262, 264, and 266 that have not been programmed. As described in more detail below, the refresh component 150 controls whether portions of a storage device, such as a memory string, uses are used for operations.

Figure 4:
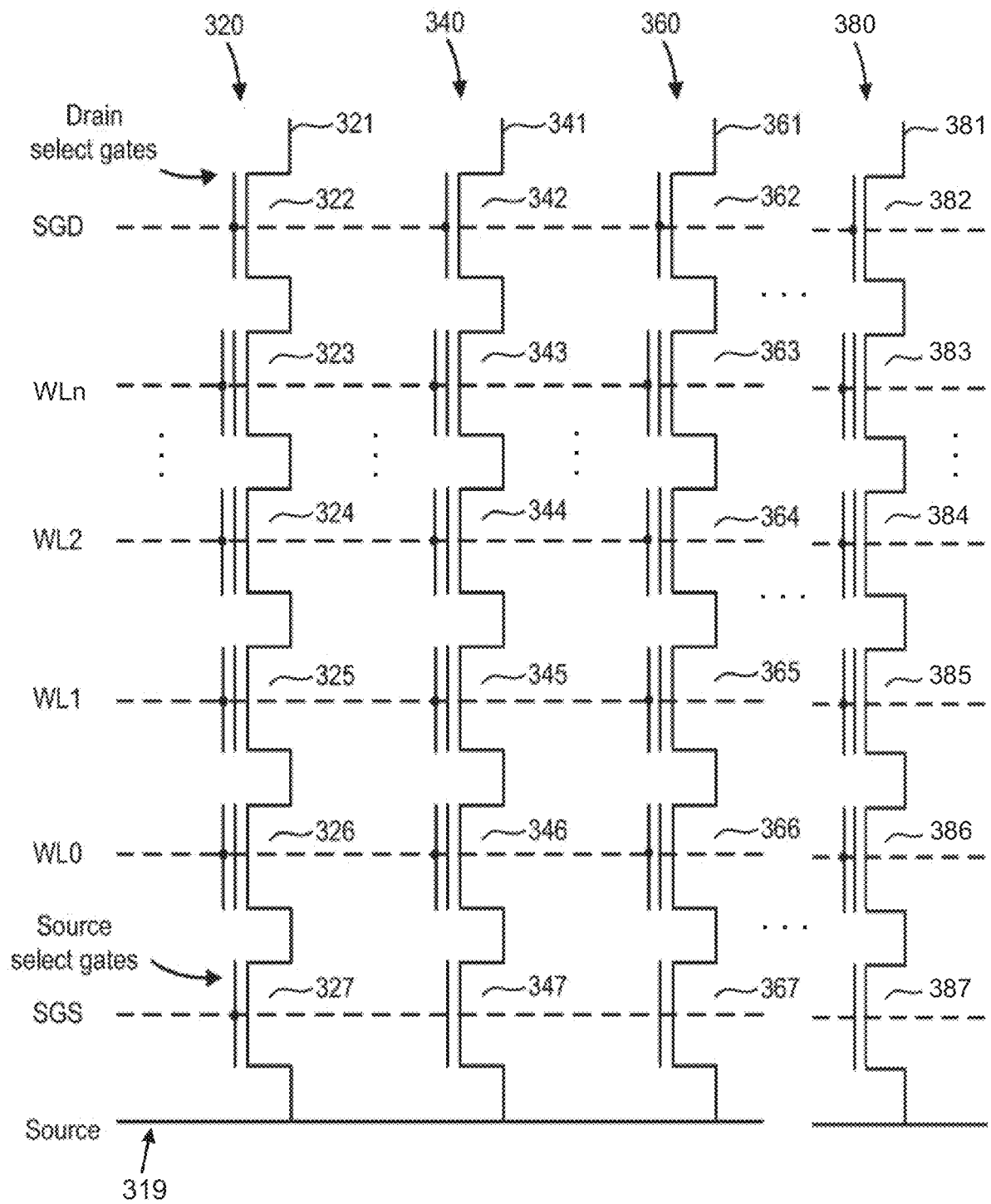
FIG. 4 is a schematic block diagram illustrating one embodiment of an array of memory cells.

FIG. 4 is a circuit diagram depicting a plurality of memory strings 320, 340, 360, and 380. The architecture for a memory system using a memory structure may include several memory strings 320, 340, 360, and 380. For example, FIG. 4 illustrates memory strings 320, 340, 360, and 380 in a memory array 200 that includes multiple memory strings 320, 340, 360, and 380. In the depicted embodiment, each memory string 320, 340, 360, and 380 includes drain select transistors 322, 342, 362, and 382, source select transistors 327, 347, 367, and 387, and storage elements 323-326, 343-346, 363-366, and 383-386. While four storage elements 323-326, 343-346, 363-366, and 383-386 per memory string 320, 340, 360, and 380 are illustrated for simplicity, some memory strings 320, 340, 360, and 380 may include any number of storage elements, e.g., thirty-two, sixty-four, or the like storage elements.

Memory strings 320, 340, 360, and 380, in one embodiment, are connected to a source line 319 by source select transistors 327, 347, 367, 387. A selection line SGS may be used to control the source side select transistors. The various memory strings 320, 340, 360, and 380, in one embodiment, are connected to bit lines 321, 341, 361, 381 by drain select transistors 322, 342, 362, and 382. The drain select transistors 322, 342, 362, and 382 may be controlled by a drain select line SGD. In some embodiments, the select lines do not necessarily need to be in common among the memory strings 320, 340, 360, and 380; that is, different select lines may be provided for different memory strings 320, 340, 360, and 380.

As described above, each word line WL0-WLn comprises one or more storage elements 323-383, 324-384, 325-385, and 326-386. In the depicted embodiment, each bit line 321, 341, 361, 381 and the respective memory string 320, 340, 360, and 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, and 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, and 326-386.

In one embodiment, each storage element 323-326, 343-346, 363-366, and 383-386 is configured to store data. For example, when storing one bit of digital data, the range of possible threshold voltages ("VTH") of each storage element 323-326, 343-346, 363-366, and 383-386 may be divided into two ranges which are assigned logical data "1" and "0." In one example of a NAND type flash memory, the VTH may be negative after the storage elements 323-326, 343-346, 363-366, and 383-386 are erased, and defined as logic "1." In one embodiment, the VTH after a program operation is positive and defined as logic "0." Other types of memory may store data using a range of possible threshold resistances, currents, or the like.

When the VTH is negative and a read is attempted, in some embodiments, storage elements 323-326, 343-346, 363-366, and 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, and 326-386 may also store multiple levels of information, for example, multiple bits of digital data. In such an embodiment, the range of VTH value is divided into the number of levels of data. For example, if four levels of information may be stored in each storage element 323-326, 343-346, 363-366, and 383-386, there will be four VTH ranges assigned to the data values "11", "10" "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, and 383-386 and the threshold voltage ranges of the storage elements 323-326, 343-346, 363-366, and 383-386 depends upon the data encoding scheme adopted for the storage elements 323-326, 343-346, 363-366, and 383-386.

In some embodiments, portions of the storage elements 323-326, 343-346, 363-366, and 383-386 may be defective. In such an embodiment, the refresh component 150 may manage which portions of the storage elements 323-326, 343-346, 363-366, and 383-386 are used for operations.

Figure 5:
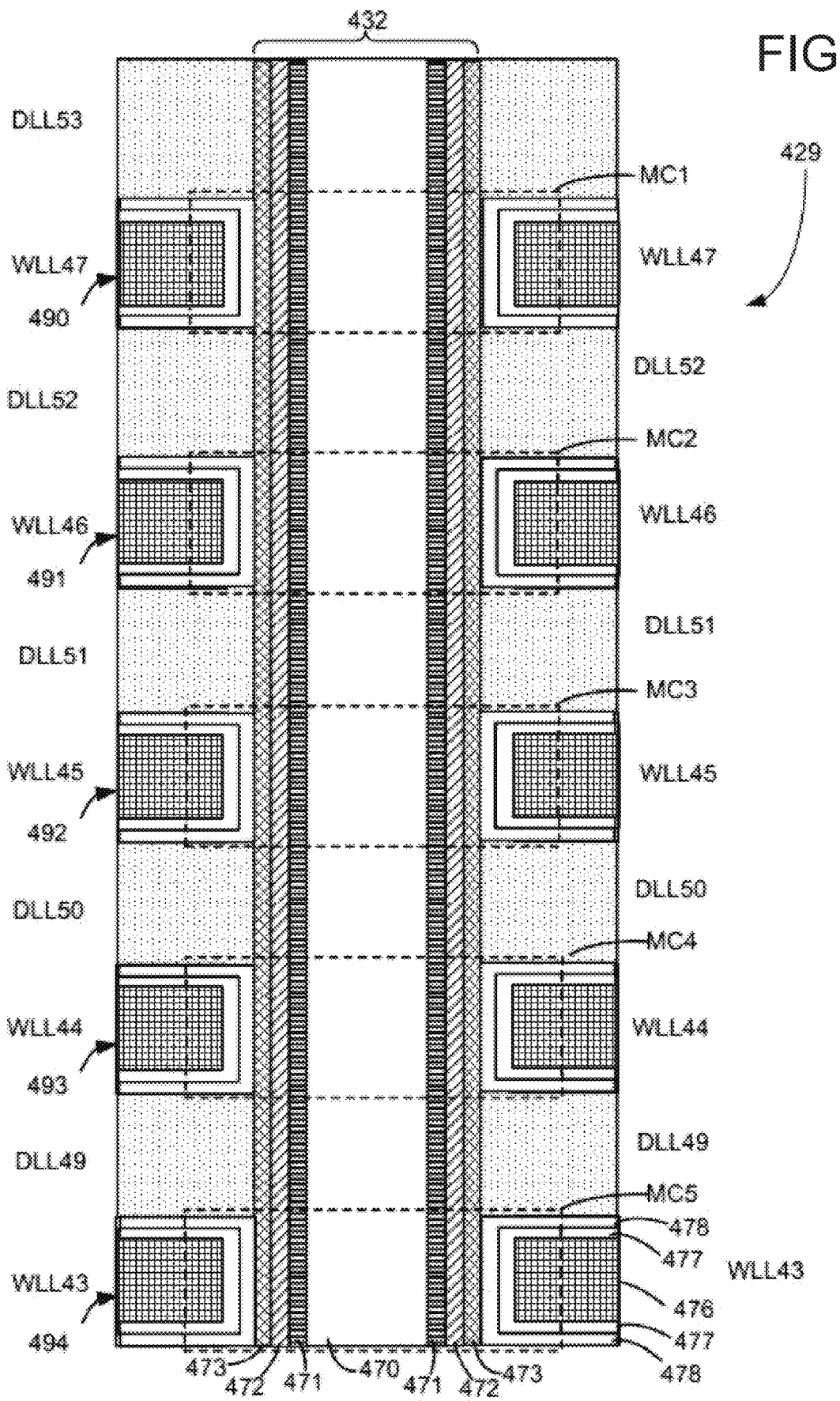
FIG. 5 is a schematic block diagram illustrating one embodiment of a three-dimensional (3-D), vertical memory structure.

FIG. 5 illustrates one embodiment of a cross-sectional view of a 3D, vertical memory structure 429 or string 429.

In one embodiment, the vertical column 432 is round and includes four layers; however, in other embodiments more or less than four layers may be included and other shapes may be used (e.g., a "U" shape instead of an "I" shape or the like). In one embodiment, a vertical column 432 includes an inner core layer 470 that is made of a dielectric, such as SiO2. Other materials may also be used. Surrounding inner core 470 is polysilicon channel 471. Materials other than polysilicon may also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge-trapping layer 473, such as (for example) Silicon Nitride. Other materials and structures may also be used. The technology described herein is not limited to any particular material or structure.

FIG. 5 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge-trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge-trapping layer 473 that is associated with the memory cell. These electrons are drawn into the charge-trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 429 (e.g., different memory strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 429 comprises an "I" shaped memory structure 429. In other embodiments, a vertical, 3D memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 6A:
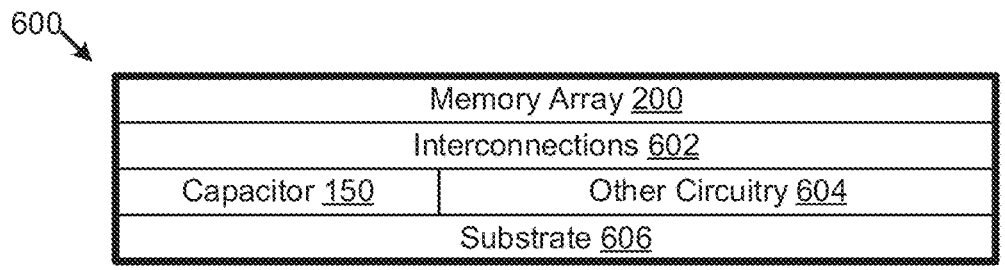
FIG. 6A is a schematic block diagram illustrating one embodiment of an integrated circuit device with an on-die capacitor.

FIG. 6A depicts one embodiment of an integrated circuit device 600 with an on-die capacitor 150. In the depicted embodiment, a memory array 200 (e.g., one or more die planes, or the like) is in one level of the integrated circuit device 600 (e.g., one or more layers of conductors, insulators, semiconductors, or the like) and the capacitor 150 and other circuitry 604 (e.g., sense amplifiers, word line switches, or the like) are in a different level of the integrated circuit device 600 (e.g., under the array 200), and are in communication with the memory array 200 through one or more interconnections 602 (e.g., insulating layers, conductive layers, through silicon vias, holes, buses, or the like).

In the depicted embodiment, the memory array 200 is in a first level of the integrated circuit device 600, and the capacitor 150 is in a second level of the integrated circuit device 600 that is parallel to and offset from the first level. A substrate 606 comprises a third level of the integrated circuit device 600 (e.g., a support structure on which one or more other layers are formed and/or deposited) and is parallel to and offset from the other layers.

Figure 6B:
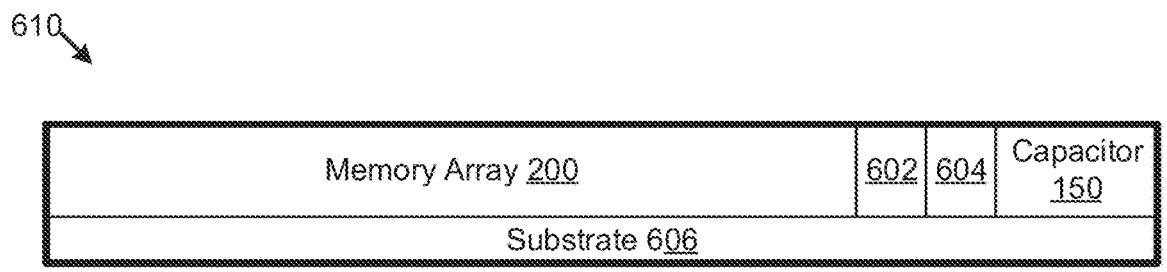
FIG. 6B is a schematic block diagram illustrating a further embodiment of an integrated circuit device with an on-die capacitor.

FIG. 6B depicts a further embodiment of an integrated circuit device 610 with an on-die capacitor 150. In the depicted embodiment, the integrated circuit device 610 includes a capacitor 150 within one or more same levels of the same integrated circuit device 610 (e.g., chip, die, die plane, or the like) as the memory array 200, along with one or more interconnections 602 and/or other circuitry 604. For example, in on embodiment, the integrated circuit device 610 may be substantially similar to the integrated circuit device 212 of FIG. 2 (e.g., a memory die 212, memory chip 212, memory die plane 212, or the like), described above.

Figure 6C:
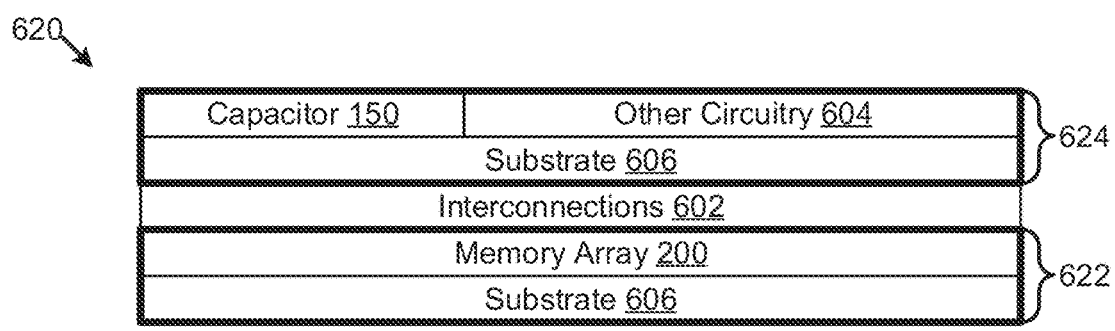
FIG. 6C is a schematic block diagram illustrating a certain embodiment of an integrated circuit device with an on-die capacitor.

FIG. 6C depicts a certain embodiment of an integrated circuit device 620 with an on-die capacitor 150. In the depicted embodiment, the integrated circuit device 620 comprises a first integrated circuit device 622 (e.g., a die, die plane, chip, or the like) comprising a memory array 200, bonded and/or otherwise electrically coupled to (e.g., via one or more interconnections 602 or the like) a second integrated circuit device 624 (e.g., a die, die plane, chip, or the like) comprising a capacitor 150. For example, the interconnections 602 may comprise solder connections, a ball grid array, electrical pins, wire bonding connections, or the like configured to transmit electricity back and forth between the one or more capacitors 150 on the second integrated circuit device 624 and the first integrated circuit device 622 (e.g., charging the one or more capacitors 150 with discharge current from an operation on the memory array 200, supplying electrical current back to the memory array 200 from the one or more capacitors 150 for a different operation, or the like). In the depicted embodiment, the first integrated circuit device 622 and the second integrated circuit device 624 each include their own substrates 606.

Figure 7A:
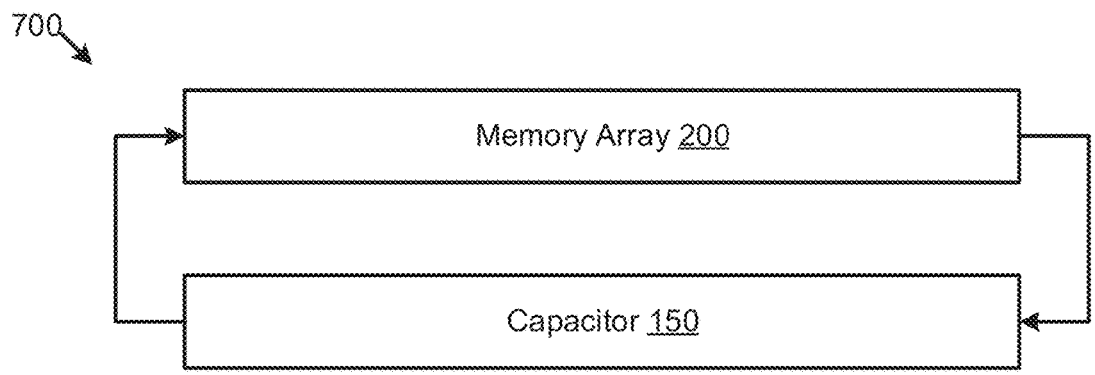
FIG. 7A is a schematic block diagram illustrating one embodiment of a supply circuit for an on-die capacitor.

FIG. 7A depicts one embodiment of a supply circuit 700 for an on-die capacitor 150. In the depicted embodiment, the supply circuit 700 includes a memory array 200 and one or more capacitors 150. The discharge of electrical current from the memory array 200 to the one or more capacitors 150 in connection with a memory operation and the supplying of electricity back to the memory array 200 for a different, subsequent memory operation may be controlled and/or coordinated by a controller 220 (e.g., an on-die controller 220, a state machine 222, read/write circuits 230, or the like).

The one or more capacitors 150 may receive electricity from an operation on the memory array 200. For example, one or more electrical lines (e.g., control lines such as word lines, bit lines, or the like) of the memory array 200 may be charged and/or biased to a target voltage level (e.g., an operational voltage level such as a bias voltage, a pass voltage, a floating voltage, a read voltage, a program voltage, an erase voltage, and/or another predefined voltage level) for a memory operation, but instead of and/or in addition to draining current from the one or more electrical lines to ground, electrical current from the one or more electrical lines (e.g., in connection with the memory operation, in response to completion of the memory operation, in response to completion of one or more stages of the memory operation, or the like) may charge the one or more capacitors 150 for reuse in a different, subsequent, memory operation. A control line of a memory array 200, as used herein, may comprise any conductor capable of conducting electricity (e.g., an electrical charge and/or current) in connection with a memory operation. For example, a control line may comprise a word line, a bit line, and/or another electrical line coupled to and/or associated with a memory array 200, one or more memory cells of a memory array 200, or the like.

For example, unselected word lines for a memory operation (e.g., word lines of an erase block not being read during a read operation, word lines of an erase block not being programmed during a program operation, or the like) may be charged to an unselected word line voltage level (e.g., a bias voltage level, a pass voltage level, or the like). A controller 220 (e.g., a state machine 222, read/write circuits 230, or the like) may cause discharge current from the unselected word line voltage on the unselected word lines may be discharged, at least partially, to charge the one or more capacitors 150, storing the discharged electricity until the one or more capacitors 150 supply the stored electricity back to unselected word lines of the memory array 200 for a different, subsequent memory operation (e.g., another read operation, program operation, or the like potentially with a different set of unselected word lines).

Figure 7B:
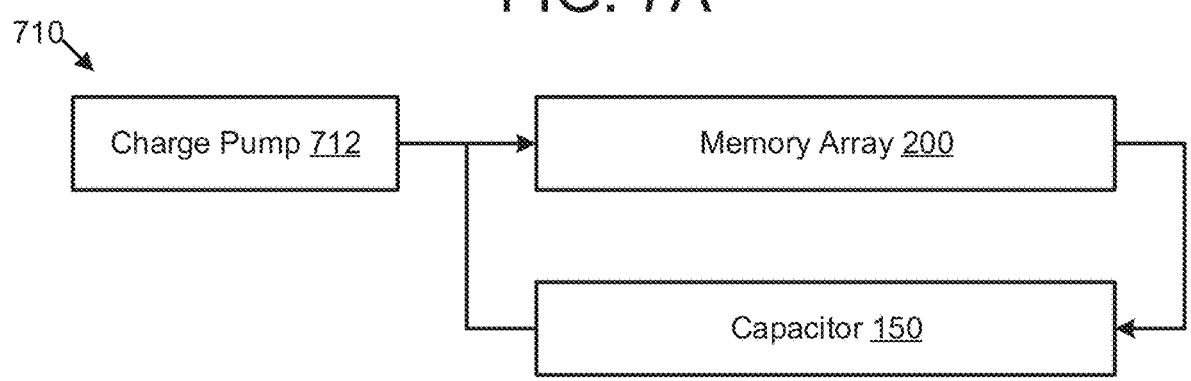
FIG. 7B is a schematic block diagram illustrating a further embodiment of a supply circuit for an on-die capacitor.

FIG. 7B depicts a further embodiment of a supply circuit 710 for an on-die capacitor 150. The supply circuit 710, in the depicted embodiment, is substantially similar to the supply circuit 700 of FIG. 7A, but with one or more charge pumps 712. In one embodiment, a charge pump 712 (e.g., a low voltage charge pump 712, or the like) may charge one or more capacitors 150 prior to a first and/or initial memory operation on the memory array 200 (e.g., a first/initial memory operation after the memory array 200 has been powered on, a first/initial memory operation after electrical charge of the one or more capacitors 150 has fallen below a threshold, a first/initial memory operation after a predefined period of time without performing a memory operation, or the like). A charge pump 712 (e.g., a low voltage charge pump 712), in some embodiments, may charge one or more capacitors 150 in parallel with discharged electricity from a memory array 200 (e.g., the charge pump 712 may charge one terminal/side/plate of a capacitor 150 and discharged electrical current from a memory array 200 may charge an opposite terminal/side/plate of the same capacitor 150, or the like).

In a further embodiment, a charge pump 712 (e.g., a low voltage charge pump 712, a high voltage charge pump 712, or the like) may charge one or more electrical lines (e.g., control lines such as word lines, bit lines, or the like) of the memory array 200 in parallel with the one or more capacitors 150. In some embodiments, one or more capacitors 150 may supply electricity to charge one or more electrical lines of a memory array 200 (e.g., one or more control lines, word lines, bit lines, or the like) up to a first voltage level and a charge pump 712 (e.g., a high voltage charge pump 712) may supply electricity to charge the same one or more electrical lines of the memory array 200 up to a second voltage level (e.g., a higher voltage level than the first voltage level). A first and/or a second voltage level may be defined by voltage, by an amount of time to reach a voltage level (e.g., a first voltage level reached in response to charging during a first ramp up period and a second voltage level reached in response to charging during a second ramp up period, or the like), and/or as a voltage at a certain point in time, or the like.

Figure 7C:
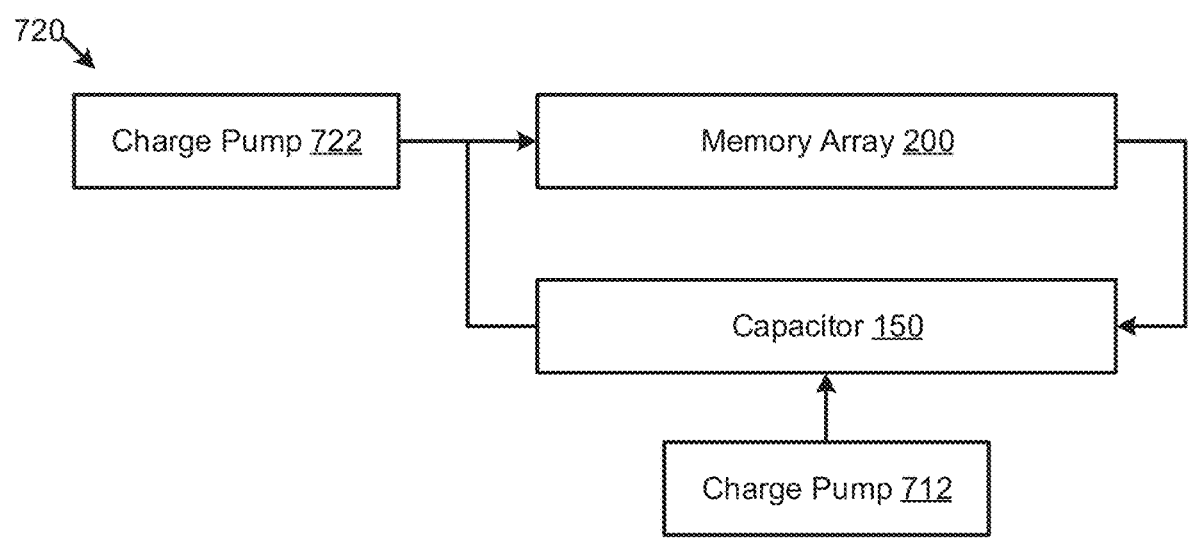
FIG. 7C is a schematic block diagram illustrating a certain embodiment of a supply circuit for an on-die capacitor.

FIG. 7C depicts a certain embodiment of a supply circuit 720 for an on-die capacitor 150. The supply circuit 720, in the depicted embodiment, is substantially similar to the supply circuit 710 of FIG. 7B, but with a first charge pump 712 and a second charge pump 722. For example, the first charge pump 712 may comprise a low voltage charge pump 712 that charges one or more capacitors 150 and/or one or more electrical lines of the memory array 200 up to a first voltage level and the second charge pump 722 may comprise a high voltage charge pump 722 that charges one or more capacitors 150 and/or one or more electrical lines of the memory array 200 up to a second voltage level (e.g., higher than the first voltage level, having a greater magnitude than the first voltage level, or the like).

Figure 7D:
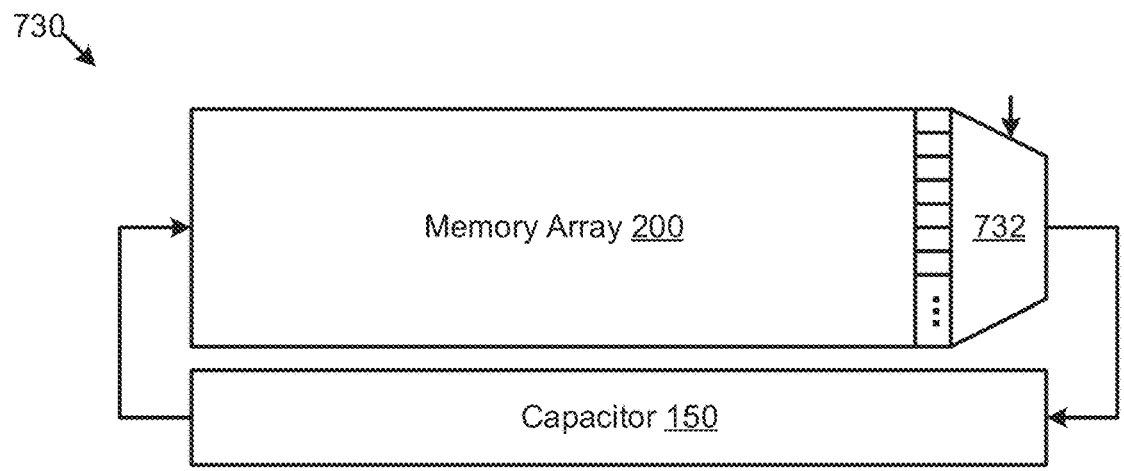
FIG. 7D is a schematic block diagram illustrating another embodiment of a supply circuit for an on-die capacitor.

FIG. 7D depicts another embodiment of a supply circuit 730 for an on-die capacitor 150. The supply circuit 730, in the depicted embodiment, includes a multiplexer 732 that collects discharged electricity (e.g., discharged electrical current or the like) from electrical lines of a memory array 200 (e.g., control lines, word lines, bit lines, unselected word lines, or the like) and combines the collected electricity, supplying it to the one or more capacitors 150.

The multiplexer 732 may receive a control signal (e.g., from an on-die controller 220, a state machine 222, an address decoder 224, a row decoder 240, read write circuits 230, or the like) indicating from which control lines or other electrical lines the multiplexer 732 is to collect discharged electricity (e.g., which word lines are unselected for a memory operation, or the like). The multiplexer 732 may receive each of a predefined type of electrical line of a memory array 200 (e.g., each control line, each word line, each bit line, or the like) as in input, and may combine a subset of the inputs (e.g., based on a control signal, or the like) into a single output, isolating the subset of the inputs and/or the output from other inputs (e.g., inputs without current to discharge).

Figure 7E:
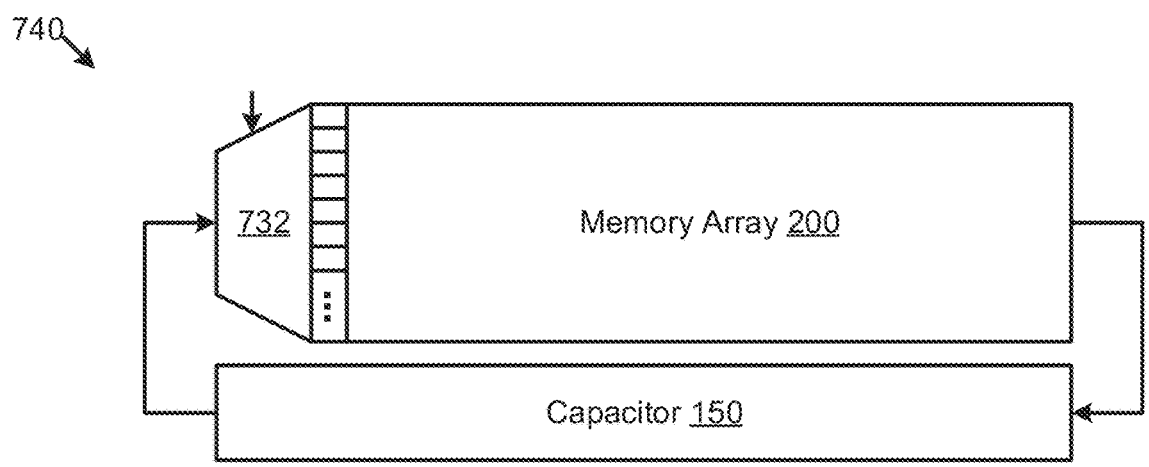
FIG. 7E is a schematic block diagram illustrating one embodiment of a supply circuit for an on-die capacitor.

FIG. 7E depicts one embodiment of a supply circuit 740 for an on-die capacitor 150. The supply circuit 740, in the depicted embodiment, includes a multiplexer 732 that divides electricity from one or more capacitors 150 (e.g., stored potential electrical energy from a previous operation) and supplies the divided electricity to electrical lines of a memory array 200 (e.g., control lines such as word lines, bit lines, unselected word lines, or the like) for a different, subsequent memory operation.

The multiplexer 732 may receive a control signal (e.g., from an on-die controller 220, a state machine 222, an address decoder 224, a row decoder 240, read write circuits 230, or the like) indicating which control lines or other electrical lines are to receive the electricity from the multiplexer 732 (e.g., which word lines are unselected for a memory operation, or the like). The multiplexer 732 may receive a single input from a capacitor 150 and may comprise outputs for each of a predefined type of electrical line of a memory array 200 (e.g., each control line, each word line, each bit line, or the like) and may select a subset of the outputs (e.g., based on a control signal, or the like) among which to divide the electrical current from the input, isolating input and/or the selected subset of the outputs from other outputs (e.g., outputs that are not to receive electrical current from the input of the multiplexer 732).

Figure 7F:
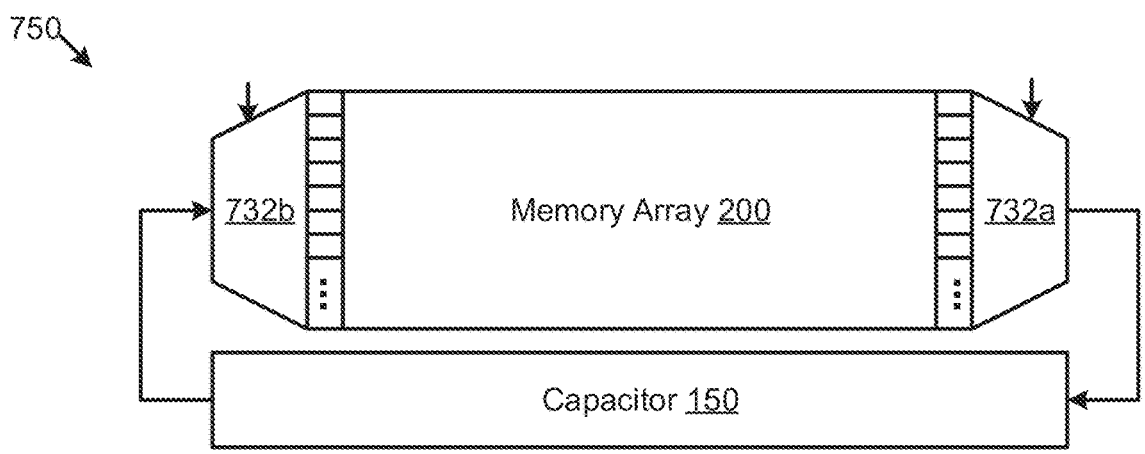
FIG. 7F is a schematic block diagram illustrating a certain embodiment of a supply circuit for an on-die capacitor.

FIG. 7F depicts a certain embodiment of a supply circuit 750 for an on-die capacitor 150. The supply circuit 750, in the depicted embodiment, includes a first multiplexer 732a configured to collect discharged electricity from electrical lines of a memory array 200 (e.g., from unselected word lines for a memory operation) to provide the collected electricity to one or more capacitors 150 and further includes a second multiplexer 732b that divides the stored electricity from the one or more capacitors 150 to supply it back to electrical lines of the memory array 200 (e.g., unselected word lines for a subsequent memory operation).

Figure 7G:
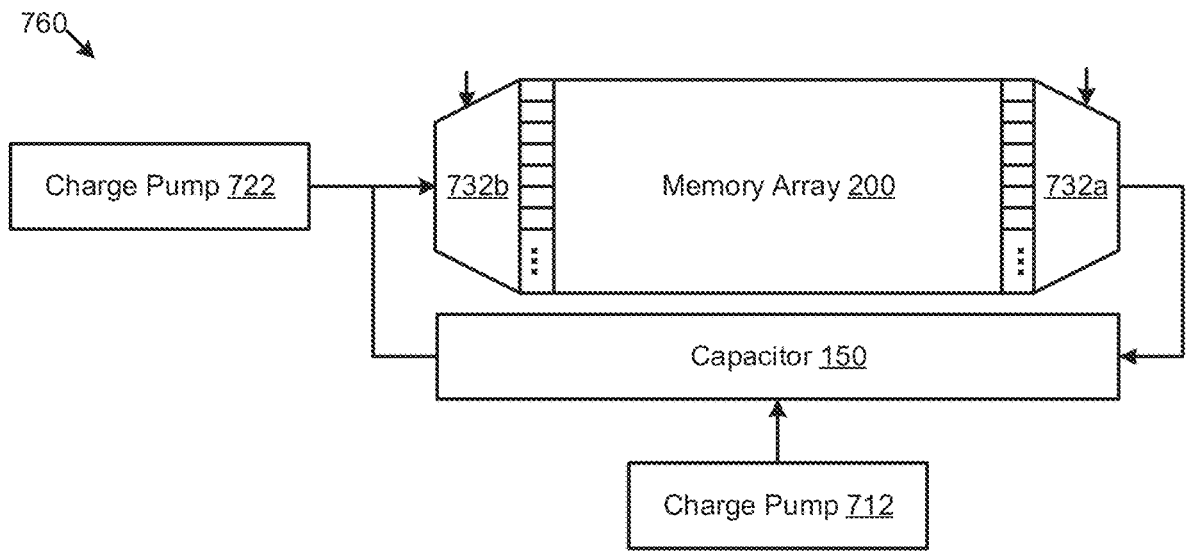
FIG. 7G is a schematic block diagram illustrating a further embodiment of a supply circuit for an on-die capacitor.

FIG. 7G depicts a further embodiment of a supply circuit 760 for an on-die capacitor 150. The supply circuit 760, in the depicted embodiment, includes a first multiplexer 732a configured to collect discharged electricity from control lines or other electrical lines of a memory array 200, to provide the collected electricity to one or more capacitors 150, and further includes a second multiplexer 732b that divides the stored electricity from the one or more capacitors 150 to supply it back to control lines or other electrical lines of the memory array 200.

The supply circuit 760 further includes a first charge pump 712 and a second charge pump 722 (e.g., a low voltage charge pump 712 that charges one or more capacitors 150 and/or one or more electrical/control lines of the memory array 200 up to a first voltage level and a high voltage charge pump 722 that charges one or more capacitors 150 and/or one or more electrical/control lines of the memory array 200 up to a second voltage level, or the like). The second multiplexer 732b may receive electricity from the one or more capacitors 150, the first charge pump 712, and/or the second charge pump 722. For example, in certain embodiments, the second multiplexer 732b may receive electricity from the one or more capacitors 150 and/or the first charge pump 712 during a first ramp up time period for a memory operation, up to a first voltage level, and may receive electricity from at least the second charge pump 722 during a second ramp up time for the memory operation, or the like.

Figure 8:
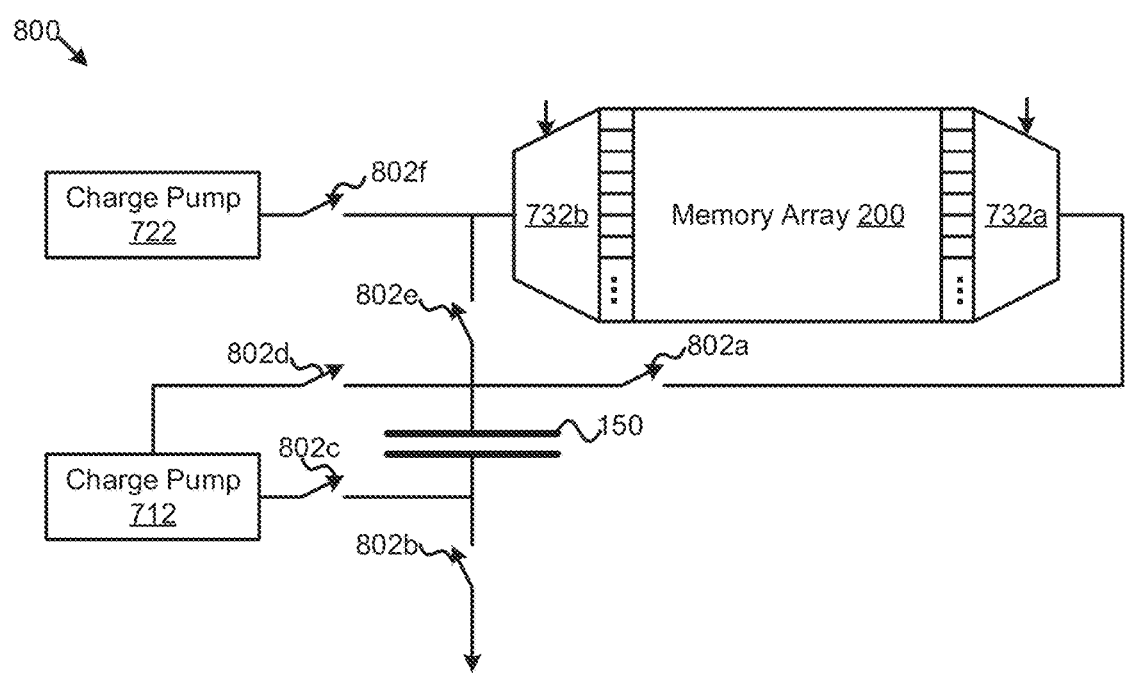
FIG. 8 is a schematic block diagram illustrating one embodiment of a supply circuit for an on-die capacitor.

FIG. 8 depicts one embodiment of a supply circuit 800 for an on-die capacitor 150. The supply circuit 800, in the depicted embodiment, includes a plurality of switches 802a-f (e.g., transistors, logic gates, or the like) to control the flow of electricity to and from the memory array 200, the one or more capacitors 150, the one or more charge pumps 712, 722, or the like. An on-die controller 220 (e.g., a power control circuit 226, an on-chip address decoder 224, a state machine 222, a read/write circuit 230, or the like) may open and/or close the switches 802a-f to control and/or coordinate memory operations on the memory array 200 (e.g., to discharge electrical charge/current from control lines or other electrical lines of the memory array 200 to one or more capacitors 150 and to supply the electrical charge/current back to control lines or other electrical lines of the memory array 200 for a different/subsequent memory operation).

In one embodiment, a first switch 802a selectively controls the flow of electrical current between a memory array 200/first multiplexer 732a and one or more capacitors 150. For example, the first switch 802a may close to allow the flow of discharged electrical current from the memory array 200 (e.g., through a first multiplexer 732a, or the like) to one or more capacitors 150, and may open while the one or more capacitors 150 store electricity between memory operations and/or while the one or more capacitors 150 supply electricity back to the memory array 200 during a subsequent memory operation.

In one embodiment, a second switch 802b may selectively connect and/or disconnect one or more capacitors 150, a first charge pump 712, or the like to ground, to a neutral voltage, or the like. A third switch 802c, in certain embodiments, may selectively connect and/or disconnect a first charge pump 712 (e.g., a low voltage charge pump 712) to an opposite side of a capacitor 150 from a side charged from the memory array 200, or the like (e.g., allowing the first charge pump 712 to selectively charge the opposite side of the capacitor 150).

In one embodiment, a fourth switch 802d may selectively connect and/or disconnect a first charge pump 712 (e.g., a low voltage charge pump 712) to the same side of a capacitor 150 charged from the memory array 200, and/or to the memory array 200 (e.g., to control lines or other electrical lines of the memory array 200 through the second multiplexer 732b, or the like). For example, the fourth switch 802d may allow the first charge pump 712 to charge a capacitor 150 prior to an initial memory operation, to charge electrical lines of a memory array 200 in parallel with a capacitor 150, or the like.

In one embodiment, a fifth switch 802e may selectively connect and/or disconnect a first charge pump 712 and/or one or more capacitors 150 to a memory array 200 (e.g., through a second multiplexer 732b for the memory array 200, or the like). For example, a fifth switch 802e may disconnect a first charge pump 712 and/or a capacitor 150 from charging a memory array 200 while the capacitor 150 is being charged from discharge current through a different connection to the memory array 200 (e.g., through a first multiplexer 732a, or the like), charged from the first charge pump 712, or the like.

In one embodiment, a fifth switch 802f may selectively connect and/or disconnect a second charge pump 722 (e.g., a high voltage charge pump 722) to a memory array 200 (e.g., through a second multiplexer 732b, or the like). For example, a fifth switch 802f may connect a second charge pump 722 to a memory array 200 during a second ramp up time period for a memory operation (e.g., up to a second voltage level, or the like).

Figure 9:
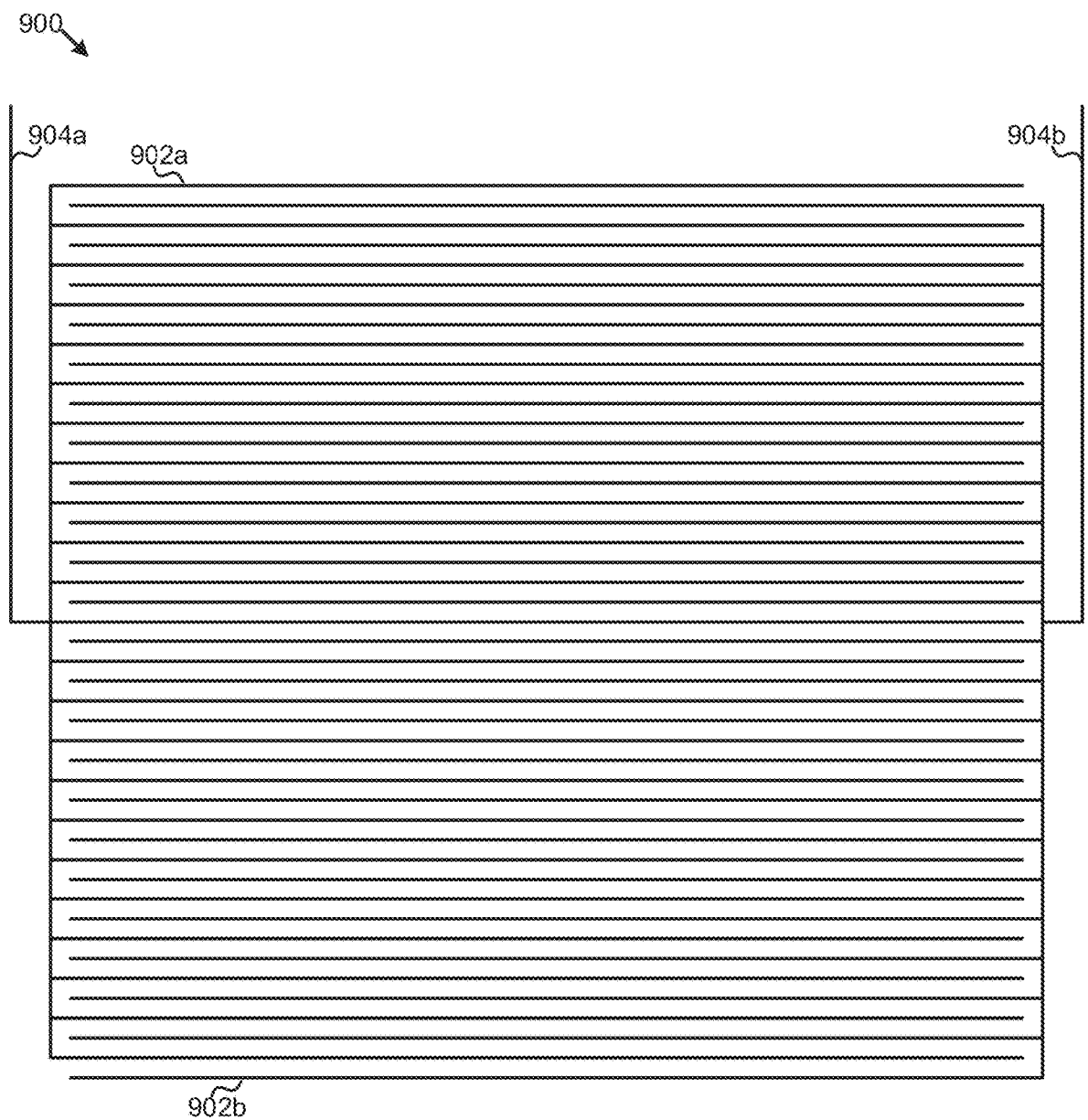
FIG. 9 is a schematic block diagram illustrating one embodiment of a word line capacitor.

FIG. 9 depicts one embodiment of a word line capacitor 900. In the depicted embodiment, even word lines 902a are electrically coupled to a first terminal 904a (e.g., a positive or negative polarity terminal 904a) and odd word lines 904b are electrically coupled to a second terminal 904b (e.g., an opposite polarity terminal 904b from the first terminal 904a). The word line capacitor 900 may utilize a capacitive coupling between the even word lines 902a and the odd word lines 902b of a memory array 200 to store discharged electricity from operations on other word lines of the memory array 200. In other embodiments, a different type of control line or other electrical line of a memory array 200 may be used as a capacitor 150, 900, instead of or in addition to word lines 902.

For example, the word line capacitor 900 may comprise dummy word lines 902 that are not used to store data, that are decoupled from bit lines of the memory array 200 (e.g., to avoid leakage through memory cells), or the like. A dummy word line 902 and/or unused word line 902, as used herein, may comprise a word line 902 at least temporarily used for a purpose other than storing data (e.g., used as a capacitor to store electricity, used as a buffer to protect other word lines from interference and/or disturb effects, or the like). A word line 902 may be referred to as unused and/or as a dummy word line 902, in certain embodiments, if the word line 902 is not being used to store data, even if the word line 902 is being used as a word line capacitor 900, as a buffer, or the like.

One or more dedicated erase blocks of a memory array 200, in certain embodiments, instead of storing data, may comprise word line capacitors 900. In a further embodiment, a portion of word lines 902*a-b* in an erase block of a memory array 200 that is used to store data are decoupled from bit lines to act as a word line capacitor 900 (e.g., dummy word lines 902*a-b* toward an edge of an erase block, between data word lines of an erase block and select gates for the erase block, or the like).

In one embodiment, word lines 902*a-b* of a word line capacitor 900 are permanently decoupled from bit lines of a memory array 200 (e.g., with a dielectric material or other insulator between the word lines 902*a-b* and the bit lines, or the like). In a further embodiment, word lines 902*a-b* of a word line capacitor 900 are selectively decoupled from bit lines of a memory array 200 (e.g., with transistors or other switches between the word lines 902*a-b* and the bit lines) such that the word lines 902*a-b* may selectively be used to either store data or as a word line capacitor 900.

Figure 10:
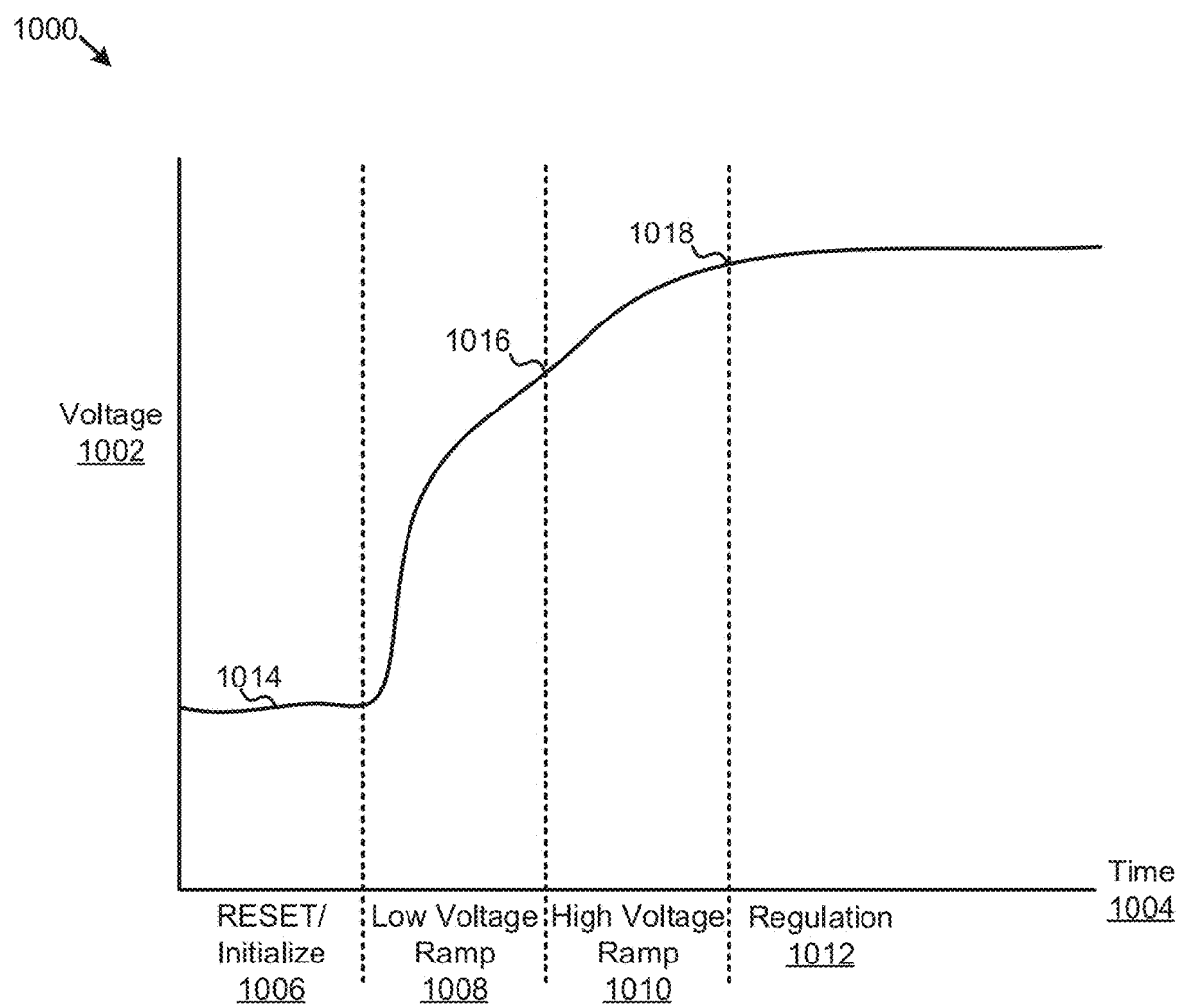
FIG. 10 is a graph illustrating one embodiment of a word line voltage.

FIG. 10 is a graph 1000 illustrating one embodiment of a word line voltage 1014, displayed as a voltage 1002 over time 1004. During a RESET/Initialize time period 1006 for a memory operation, the word line voltage 1014 may be relatively constant, at a ground voltage, source voltage (e.g., VSS), or the like. During a low voltage ramp up time period 1008, one or more capacitors 150 and/or a low voltage charge pump 712 may drive the word line voltage 1014 up to a first voltage level 1016. During a high voltage ramp up time period 1010 at least a high voltage charge pump 722 may drive the word line voltage 1014 up to a second voltage level 1018 (e.g., an operational voltage for a memory operation, or the like) and may hold and/or regulate the word line voltage 1014 at or near the second voltage level 1018 during a regulation time period 1012.

Figure 11:
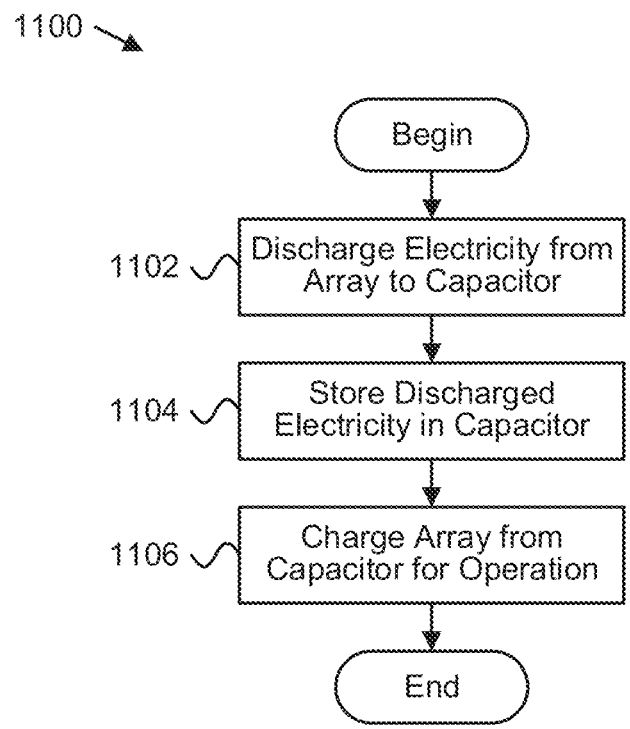
FIG. 11 is a schematic flow chart diagram illustrating one embodiment of a method for an on-die capacitor.

FIG. 11 depicts one embodiment of a method 1100 for an on-die capacitor 150. The method 1100 begins and one or more electrical lines (e.g., control lines, unselected word lines) of a memory array 200 discharge 1102 electricity from a first memory operation on the memory array 200 to a capacitor 150. The capacitor 150 stores 1104 the discharged 1102 electricity. The capacitor 150 charges 1106 one or more electrical lines (e.g., a different set of control lines such as unselected word lines or the like) of the memory array 200 for a second memory operation on the memory array using the stored 1104 electricity and the method 1100 ends.

Figure 12:
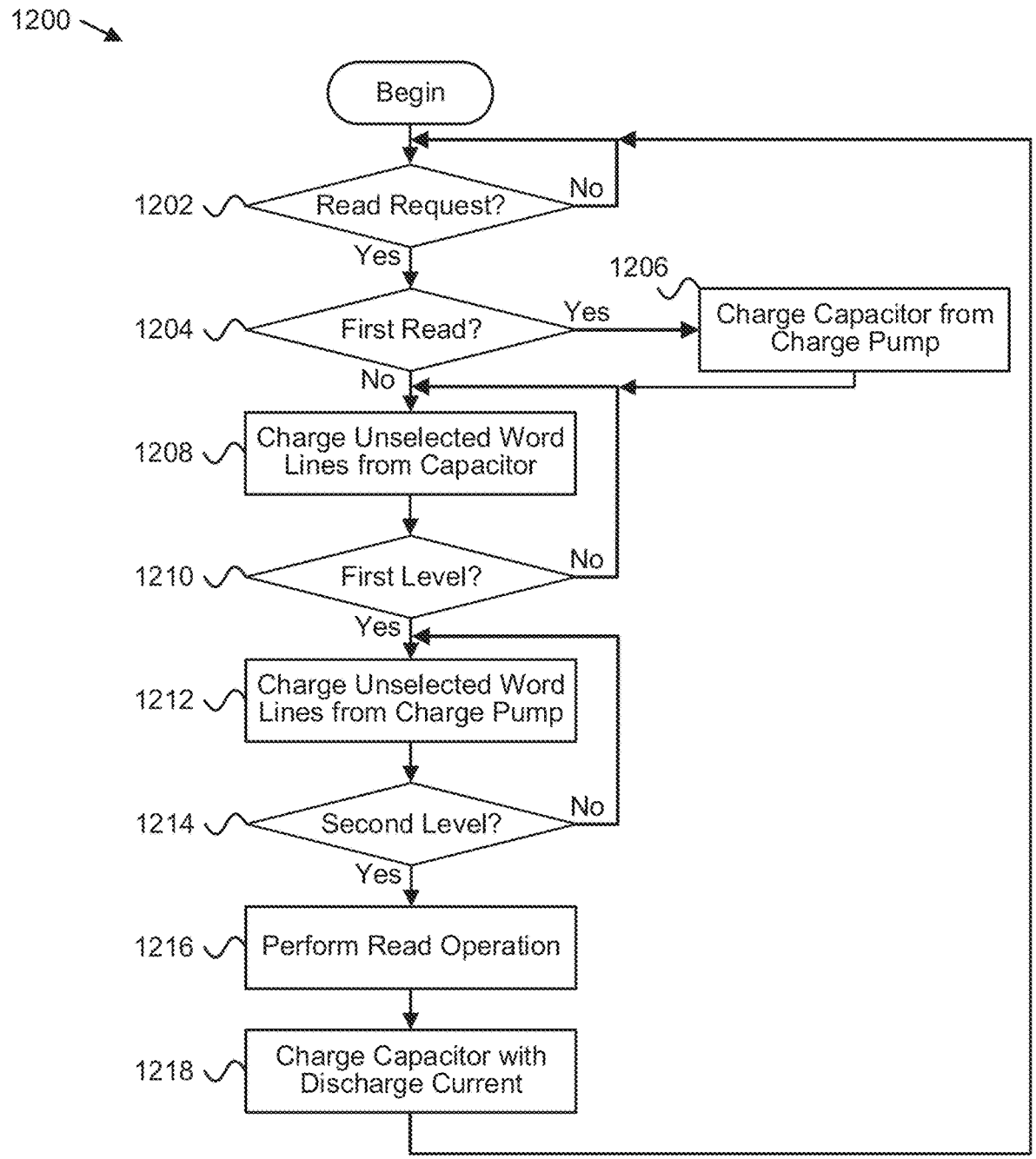
FIG. 12 is a schematic flow chart diagram illustrating a further embodiment of a method for an on-die capacitor.

FIG. 12 depicts a further embodiment of a method 1200 for an on-die capacitor 150. An on-die controller 220 determines 1202 if a read request has been received, if a program verify operation is to be performed, if an erase verify operation is to be performed, or the like for a memory array 200. In response to determining 1202 that a read request has been received and/or that a program/erase verify operation is to be performed, the on-die controller 220 determines 1204 whether the read/verify operation will be a first read for the memory array 200 (e.g., a first and/or initial read/verify operation after being powered on, after a predetermined amount of time has passed since a previous read/verify operation, after a voltage level of a capacitor 150 has fallen below a threshold, or the like). If the on-die controller 220 determines 1204 that the read/verify operation is a first read operation, a charge pump 712, 722 charges 1206 a capacitor 150.

The capacitor 150 charges 1208 unselected word lines of the memory array 200 for the read/verify operation until the on-die controller 220 determines 1210 that the unselected word lines have been charged 1208 up to a first voltage level. A charge pump 712, 722 charges 1212 the unselected word lines of the memory array 200 for the read/verify operation until the on-die controller 220 determines 1214 that the unselected word lines have been charged 1212 up to a second voltage level (e.g., higher than the first voltage level).

In response to the on-die controller 220 determining 1214 that the unselected word lines of the memory array 200 for the read/verify operation have been charged 1212 up to the second voltage level, read/write circuits 230 perform 1216 the read/verify operation on the memory array 200 and the unselected word lines for the read/verify operation on the memory array 200 charge 1218 the capacitor 150 with discharge current from the read/verify operation. The method 1200 continues, such that the capacitor 150 may charge 1208 a different set of unselected word lines for a subsequent read/verify operation using the charge 1218 from the read/verify operation.

A means for storing electrical charge from current discharged from an operation on a non-volatile memory array 200, in various embodiments, may comprise a capacitor 150, word lines 902*a-b*, a battery, a super capacitor, an integrated circuit device 123, 600, 610, 624, an on-die controller 220, a state machine 222, a power control circuit 226, an on-die address decoder 224, a supply circuit 700, 710, 720, 730, 740, 750, 760, 800, a multiplexer 732, a switch 802*a-f*, and/or other electrical hardware. Other embodiments may comprise substantially similar or equivalent means for storing electrical charge.

A means for charging a plurality of control lines or other electrical lines of a non-volatile memory array 200 to a first voltage using stored electrical charge, in various embodiments, may comprise a capacitor 150, word lines 902*a-b*, a battery, a super capacitor, an integrated circuit device 123, 600, 610, 624, an on-die controller 220, a state machine 222, a power control circuit 226, an on-die address decoder 224, a supply circuit 700, 710, 720, 730, 740, 750, 760, 800, a multiplexer 732, a charge pump 712, 722, a switch 802*a-f*, and/or other electrical hardware. Other embodiments may comprise substantially similar or equivalent means for charging a plurality of control lines or other electrical lines.

A means for charging a plurality of control lines or other electrical lines of a non-volatile memory array 200 to a second voltage higher than a first voltage for a different operation, in various embodiments, may comprise a capacitor 150, word lines 902*a-b*, a battery, a super capacitor, an integrated circuit device 123, 600, 610, 624, a multiplexer 732, a charge pump 712, 722, a switch 802*a-f*, an on-die controller 220, a state machine 222, a power control circuit 226, an on-die address decoder 224, a supply circuit 700, 710, 720, 730, 740, 750, 760, 800, and/or other electrical hardware. Other embodiments may comprise substantially similar or equivalent means for charging a plurality of control lines or other electrical lines.

A means for charging a means for storing electrical charge from a different source prior to an operation, in various embodiments, may comprise a charge pump 712, 722, a capacitor 150, word lines 902*a-b*, a battery, a super capacitor, an integrated circuit device 123, 600, 610, 624, a multiplexer 732, a switch 802*a-f*, an on-die controller 220, a state machine 222, a power control circuit 226, an on-die address decoder 224, a supply circuit 700, 710, 720, 730, 740, 750, 760, 800, and/or other electrical hardware. Other embodiments may comprise substantially similar or equivalent means for charging a means for storing electrical charge.

A means for collecting discharged current from one or more control lines such as unselected electrical lines for an operation and supplying the collected discharged current to a means for storing electrical charge, in various embodiments, may comprise a multiplexer 732, an integrated circuit device 123, 600, 610, 624, a switch 802*a-f*, an on-die controller 220, a state machine 222, a power control circuit 226, an on-die address decoder 224, a supply circuit 700, 710, 720, 730, 740, 750, 760, 800, and/or other electrical hardware. Other embodiments may comprise substantially similar or equivalent means for collecting discharged current.

A means for dividing electrical current from a means for storing electrical charge between a plurality of control lines or other electrical lines for a different operation, in various embodiments, may comprise a multiplexer 732, an integrated circuit device 123, 600, 610, 624, a switch 802*a-f*, an on-die controller 220, a state machine 222, a power control circuit 226, an on-die address decoder 224, a supply circuit 700, 710, 720, 730, 740, 750, 760, 800, and/or other electrical hardware. Other embodiments may comprise substantially similar or equivalent means for dividing electrical current.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
a memory chip comprising an array of memory cells that includes a first conductive line and a second conductive line, the first conductive line biased to a first voltage for a first memory operation; and
a capacitor selectively coupled to the array of memory cells after the first memory operation has completed to receive discharged electricity from the first conductive line and bias the second conductive line to a second voltage for a second memory operation.

2. The apparatus of claim 1, further comprising a charge pump electrically coupled to the array of memory cells in parallel with the capacitor.

3. The apparatus of claim 2, wherein the charge pump supplies electricity bias the second conductive line to a third voltage higher than the second voltage.

4. The apparatus of claim 1, further comprising a charge pump electrically coupled to the capacitor, the charge pump charging the capacitor prior to the first memory operation.

5. The apparatus of claim 4, wherein the first memory operation comprises an initial operation performed on the memory cells after the memory chip is powered on.

6. The apparatus of claim 4, wherein the charge pump charges one side of the capacitor and the first conductive line charges an opposite side of the capacitor.

7. The apparatus of claim 1, wherein the capacitor comprises two or more word lines of the array of memory cells, with one or more even word lines of the word lines coupled to a first terminal of the capacitor and one or more odd word lines of the word lines coupled to a second terminal of the capacitor.

8. The apparatus of claim 7, wherein the two or more word lines of the capacitor are decoupled from one or more bit lines of the array of memory cells.

9. The apparatus of claim 1, wherein the capacitor is one or more of:
disposed in one or more layers of the memory chip between the array of memory cells and a substrate of the memory chip;
disposed adjacent to the array of memory cells in one or more same layers of the memory chip as the array of memory cells; and
disposed on a different integrated circuit chip bonded to the memory chip such that the capacitor on the different integrated circuit chip is electrically coupled to the array of memory cells on the memory chip.

10. The apparatus of claim 1, wherein the first memory operation and the second memory operation comprise one or more of a program operation and a read operation for the array of memory cells.

11. The apparatus of claim 1, wherein the capacitor supplies the electricity to unselected word lines for the second memory operation.

12. The apparatus of claim 11, further comprising a first multiplexer for selectively coupling the capacitor to the array of memory cells.

13. An apparatus comprising:
a controller configured to discharge electrical charge from control lines of a first erase block of a memory element in connection with a first memory operation on the first erase block; and
a supply circuit configured to supply electrical charge for a second memory operation from a second erase block of the memory element configured to receive the discharged electrical charge from the first erase block, the second erase block storing the discharged electrical charge using a capacitance between control lines of the second erase block.

14. The apparatus of claim 13, wherein the supply circuit is further configured to supply the electrical charge from the control lines of the second erase block to control lines of a third erase block of the memory element for the second memory operation.

15. The apparatus of claim 14, further comprising a charge pump configured to charge the control lines of the third erase block to a higher voltage level than a voltage level of the stored electrical charge from the control lines of the second erase block.

16. The apparatus of claim 13, wherein the control lines of the first erase block comprise unselected word lines in connection with the first memory operation and the control lines of the second erase block comprise word lines of the second erase block decoupled from bit lines of the second erase block.

17. The apparatus of claim 16, wherein one or more even word lines of the word lines of the second erase block are coupled to a first capacitor terminal and one or more odd word lines of the word lines of the second erase block are coupled to a second capacitor terminal of an opposite polarity as the first capacitor terminal.

18. A method comprising:
- biasing a first conductor of a memory array to a first voltage for a first memory operation;
- after completing the first memory operation, transferring charge from the first conductor to a capacitor; and
- using the charged capacitor to bias a second conductor of the memory array to a second voltage for a second memory operation.

19. The method of claim 18, further comprising using the charged capacitor to bias a plurality of second conductors of the memory array to a second voltage for a second memory operation.

20. The method of claim 18, further comprising using a charge pump to bias the second conductor from the second voltage to a third voltage for the second memory operation.

\* \* \* \* \*